US012642008B2

(12) United States Patent    (10) Patent No.:   US 12,642,008 B2

Lin et al.         (45) Date of Patent:     May 26, 2026

(54) MEMORY DEVICE AND SEMICONDUCTOR DIE

(71) Applicant: Taiwan Semiconductor Manufacturing Company, Ltd., Hsinchu (TW)

(72) Inventors: Shy-Jay Lin, Hsinchu County (TW); Nuo Xu, San Jose, CA (US); Yen-Lin Huang, Menlo Park, CA (US)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 321 days.

(21) Appl. No.: 17/732,548

(22) Filed: Apr. 29, 2022

(65) Prior Publication Data

US 2023/0354719 A1     Nov. 2, 2023

(51) Int. Cl.
| | |
|---|---|
| *H10N 52/80* | (2023.01) |
| *H10B 61/00* | (2023.01) |
| *H10N 52/00* | (2023.01) |

(52) U.S. Cl.
CPC ............. *H10N 52/80* (2023.02); *H10B 61/00* (2023.02); *H10N 52/00* (2023.02)

(58) Field of Classification Search
CPC ........ H10N 52/80; H10N 52/00; H10N 50/01; H10N 50/10; G11C 11/02; G11C 11/18; H10B 61/00; H10B 61/22
See application file for complete search history.

(56) References Cited

U.S. PATENT DOCUMENTS

2020/0235288 A1 * 7/2020 Ikegawa ................ H10N 50/10
2020/0341079 A1 * 10/2020 Swerts ................... H10B 61/00

FOREIGN PATENT DOCUMENTS

CN      111490156 A * 8/2020 ........... H01L 27/222
EP      3863015 A1 * 6/2021 ........... G11C 11/161

* cited by examiner

*Primary Examiner* — Latanya N Crawford Eason

(74) *Attorney, Agent, or Firm* — JCIPRNET

(57) ABSTRACT

A memory device including a pair of magnetic conductive posts, a Spin-Hall-Effect-assisted (SHE-assisted) layer, and a magnetic tunneling junction (MTJ) structure. The Spin-Hall-Effect-assisted (SHE-assisted) layer is disposed over and electrically connected to the pair of magnetic conductive posts. The magnetic tunneling junction (MTJ) structure has in-plane magnetic anisotropy, wherein the MTJ structure is disposed on the SHE-assisted layer, and the pair of magnetic conductive posts provide an in-plane magnetic field during a write operation of the MTJ structure.

20 Claims, 12 Drawing Sheets

MEMORY DEVICE AND SEMICONDUCTOR DIE

BACKGROUND

Some integrated circuit manufacturing processes include manufacturing steps associated with making data storage circuit elements. Data storage elements such as Dynamic Random Access Memory (DRAM), Static Random Access Memory (SRAM), flash memory (a form of non-volatile memory), place data storage circuit elements in an integrated circuit in tightly-packed arrays of elements, to minimize the amount of die area occupied by data storage elements. Magnetoresistive Random Access Memory (MRAM) is a type of data storage element in which information is stored based on the orientation of a magnetic field in a circuit element. MRAM uses the magnetic field to store information rather than the presence/absence of electrical charge in a storage circuit element, or with the quantity of electronic charge stored in a data storage circuit element. Existing Spin transfer torque MRAM (STT-MRAM) technology has several challenges: for example, the write speed is limited to greater than 10 nano-seconds and write endurance suffers the breakdown issues of the dielectric tunneling barrier layer in magnetic tunnel junction (MTJ). Spin-orbit torque MRAM (SOT-MRAM) is a promising alternative to replace STT-MRAM for high speed (less than 1 nano-second) and endurance (due to decoupled write and read paths, no breakdown issues for dielectric tunneling barrier layer).

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
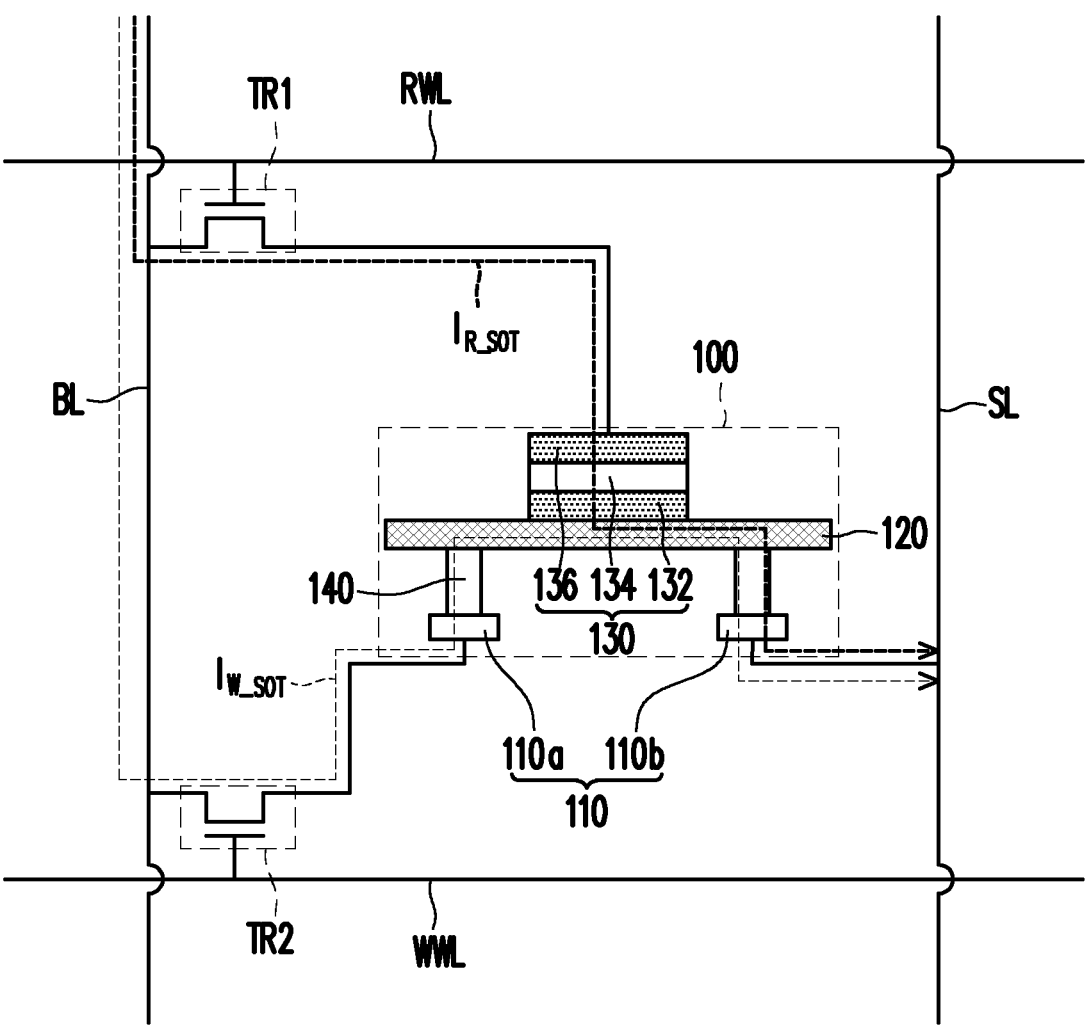
FIG. 1 illustrates a schematic view of a memory device electrically connected to a bit line, a read word line, a write word line and a source line in accordance with some embodiments.

The following disclosure provides many different embodiments, or examples, for implementing different features of the provided subject matter. Specific examples of components, values, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Magnetoresistive random access memory (MRAM) cell is a form of data storage element for integrated circuits. In comparison with other devices, MRAM cell uses small amounts of power to read and write data. MRAM also has long data retention times in comparison with other devices. In some embodiments, MRAM cells have multi-year data retention times, while the power consumption for reading and writing data is similar to single read or write operations for dynamic random access memory (DRAM) cells. However, in contrast to DRAM cells, MRAM cells are able to store data without regular refreshing of cells in order to preserve stored data.

MRAM cells include magnetic tunnel junctions (MTJs) that enable the use of tunneling magnetoresistance (TMR) to determine the information state of an MRAM cell. A magnetic tunnel junction includes a stack of at least three layers, including a dielectric tunneling barrier layer and two ferromagnetic layers separated by the dielectric tunneling barrier layer. The two ferromagnetic layers includes a reference layer (also called a magnetic pinned layer) and a free layer (also called a magnetic storage layer). The reference layer has a layer of magnetizable material with a locked magnetic field orientation, and the free layer has a layer of magnetizable material where the magnetic field orientation changes between different orientations.

When the magnetic field of the reference layer and the free layer are aligned having the same orientation, the MRAM cell allows a large amount of current to flow in comparison to the allowed amount of current flowing through the MRAM cell when the magnetic field of the reference layer and the magnetic field of the free layer have opposite orientations. The different amounts of current are associated with different information states (e.g., a high amount of current is associated with a "1" bit, and a low amount of current is associated a "0" bit, or vice versa) of the MRAM cell.

MRAM cells are of increasing interest in integrated circuit and semiconductor manufacturing because the magnetic fields of MRAM cells are able to provide long-term data storage. In some embodiments, the magnetization of the reference layer and/or the free layer of an MTJ in an MRAM cell retain the magnetic field orientations associated with a stored bit of information for up to several years, or longer, before thermally-induced field flipping occurs. The read time and the write time of MRAM cells are fast (on the order of DRAM cell reading speed), but the data retention time is at orders of magnitude longer than data retention time of DRAM cells without refreshing.

A stored bit of information may be written into the free layer by applying charge current passing through an MTJ of an MRAM cell. The applied charge current passing through the reference layer becomes spin polarized and exerts a torque on the free layer. The direction of the applied charge current and magnetization of the reference layer determines the direction of generated torque. A large enough torque can switch the magnetic field of the free layer. When performing a "write" procedure of the MRAM cell, a bidirectional charge current is required to determine the information state (i.e. magnetic field) of the free layer such that a "0" bit or a "1" bit may be stored in the MTJ of the MRAM cell.

SOT-MRAM has the potential to challenge STT-MRAM, as it is a faster, denser and much more efficient memory technology. SOT-MRAM devices feature switching of the free magnetic layer done by injecting an in-plane current in an adjacent SOT layer, unlike STT-MRAM where the current is injected perpendicularly into the magnetic tunnel junction and the read and write operation is performed through the same path.

FIG. 1 illustrates a schematic view of a memory device electrically connected to a bit line, a read word line, a write word line and a source line in accordance with some embodiments.

Referring to FIG. 1, the memory device includes SHE-assisted SOT-MRAM cells 100 arranged in array. The memory device may further include bit lines BL, source lines SL, read word lines RWL, and write word lines WWL. For simplicity of illustration, only one SHE-assisted SOT-MRAM cell 100 electrically connected to one bit line BL, one source line SL, one read word line RWL and one write word line WWL is shown in FIG. 1. The respective number of the SHE-assisted SOT-MRAM cell 100, the bit line BL, the source line SL, the read word line RWL and the write word line WWL is not limited in the present invention. As illustrated in FIG. 1, the SHE-assisted SOT-MRAM cell 100 includes a pair of magnetic conductive posts 110, a Spin-Hall-Effect-assisted (SHE-assisted) layer 120, and a magnetic tunneling junction (MTJ) structure 130. The SHE-assisted layer 120 is disposed over and electrically connected to the pair of magnetic conductive posts 110. The magnetic tunneling junction (MTJ) structure 130 has in-plane magnetic anisotropy, wherein the MTJ structure 130 is disposed on the SHE-assisted layer 120, and the pair of magnetic conductive posts 110 provide a perpendicular magnetic field during the write operation of the MTJ structure 130. The material of the pair of magnetic conductive posts 110 may be or include Co or other suitable ferromagnetic materials. The material of the SHE-assisted layer 120 may be or include platinum (Pt), tantalum (Ta) or other suitable heavy metallic materials.

In some embodiments, the pair of the magnetic conductive posts 110 include a first magnetic conductive post 110a and a second magnetic conductive post 110b spaced apart from the first magnetic conductive post 110a, and the SHE-assisted layer 120 covers as well as extends from the first magnetic conductive post 110a to the second magnetic conductive post 110b. The thickness (height) of the pair of magnetic conductive posts 110a and 110b may range from about 60 nm to about 120 nm, and the width of the pair of magnetic conductive posts 110a and 110b may be about 60 nm. The length of the SHE-assisted layer 120 may be about 100 nm, and the width of the SHE-assisted layer 120 may be about 5 nm. It is noted that one or more MTJ structures 130 may be formed on the SHE-assisted layer 120 having a length of about 100 nm.

In some embodiments, the MTJ structure 130 includes a first ferromagnetic layer 132 disposed on and in contact with the SHE-assisted layer 120; a second ferromagnetic layer 136 disposed over the first ferromagnetic layer 132; and a tunneling barrier layer 134 disposed between the first ferromagnetic layer 132 and the second ferromagnetic layer 136. The material of the first ferromagnetic layer 132 may be or include Fe, Co, NoFe, CoFe, CoFeB or the like. The material of the second ferromagnetic layer 136 may be or include Fe, Co, NoFe, CoFe, CoFeB or the like. The material of the tunneling barrier layer 134 may be or include MgO, $Al_2O_3$ or the like. The material of the first ferromagnetic layer 132 and the material of the second ferromagnetic layer 136 may be different from each other.

The magnetic field orientation of the second ferromagnetic layer 136 has at least one layer of magnetizable material with a locked magnetic field orientation, and the first ferromagnetic layer 132 has at least one layer of magnetizable material where the magnetic field orientation changes between different in-plane orientations. When the magnetic field of the first ferromagnetic layer 132 and the second ferromagnetic layer 136 are aligned having the same orientation, the MTJ structure 130 allows a large amount of current to flow in comparison to the allowed amount of current flowing through the MTJ structure 130 when the magnetic field of the first ferromagnetic layer 132 and the magnetic field of the second ferromagnetic layer 136 have opposite orientations. The different amounts of current are associated with different information states (e.g., a high amount of current is associated with a "1" bit, and a low amount of current is associated a "0" bit, or vice versa) of the MTJ structure 130.

As illustrated in FIG. 1, the memory device further includes a first transistor TR1 and a second transistor TR2. The gate of the first transistor TR1 is electrically connected to the read word line RWL, one of the pair of source/drain of the first transistor TR1 is electrically connected to the bit line BL, and the other one of the pair of source/drain of the first transistor TR1 is electrically connected to the second ferromagnetic layer 136 of the SHE-assisted SOT-MRAM cell 100. The gate of the second transistor TR2 is electrically connected to the write word line WWL, one of the pair of source/drain of the second transistor TR2 is electrically connected to the bit line BL, and the other one of the pair of source/drain of the second transistor TR2 is electrically connected to the first magnetic conductive posts 110a. Furthermore, the second magnetic conductive posts 110b is electrically connected to the source line SL.

When a SOT write procedure of the SHE-assisted SOT-MRAM cell 100 is performed, the channel of the second transistor TR2 electrically coupled to the write word line WWL is turned on, and a write current $I_{W\_SOT}$ propagated by the bit line BL sequentially flows through the channel of the second transistor TR2, the first magnetic conductive posts 110a, the SHE-assisted layer 120, the second magnetic conductive posts 110b and the source line SL. During SOT write procedure of the SHE-assisted SOT-MRAM cell 100, the write current $I_{W\_SOT}$ flows through the SHE-assisted layer 120 horizontally, and the write current $I_{W\_SOT}$ enables the first magnetic conductive posts 110a and the second magnetic conductive posts 110b providing a perpendicular magnetic field, which facilitates that a bit of information is stored in the MTJ structure 130 of the SHE-assisted SOT-MRAM cell 100. A stored bit of information is successfully written into the first ferromagnetic layer 132 of the MTJ structure 130 by applying the write current $I_{W\_SOT}$ passing through the SHE-assisted layer 120. The applied write current $I_{W\_SOT}$ passing through the SHE-assisted layer 120 becomes spin polarized and exerts a torque on the first ferromagnetic layer 132 of the MTJ structure 130. The direction of the write current $I_{W\_SOT}$ and magnetization of the second ferromagnetic layer 136 determine the direction of generated torque.

In some embodiments, the width of the SHE-assisted layer 120 is about 130 nm, the thickness of the SHE-assisted layer 120 is about 5 nm, the radius of the conductive vias 140 is about 15 nm, the thickness of the conductive vias 140 is about 50 nm, the width of the magnetic conductive posts 110a and 110b is about 60 nm, the thickness of the magnetic conductive posts 110a and 110b is about 60 nm, and a perpendicular magnetic field greater than 400 Oe (e.g., $M_{co}$=800 emu/cc=8*10^5 A/m (z); $\mu_{Co}/\mu_0$=18000; and relative permeability=1) is provided by the magnetic conductive posts 110a and 110b having a thickness of about 60 nm.

In some other embodiments, the width of the SHE-assisted layer 120 is about 130 nm, the thickness of the SHE-assisted layer 120 is about 5 nm, the radius of the conductive vias 140 is about 15 nm, the thickness of the conductive vias 140 is about 50 nm, the width of the magnetic conductive posts 110a and 110b is about 60 nm, the thickness of the magnetic conductive posts 110a and 110b is about 80 nm, and a perpendicular magnetic field greater than 450 Oe is provided by the magnetic conductive posts 110a and 110b having a thickness of about 80 nm.

In some other embodiments, the width of the SHE-assisted layer 120 is about 130 nm, the thickness of the SHE-assisted layer 120 is about 5 nm, the radius of the conductive vias 140 is about 15 nm, the thickness of the conductive vias 140 is about 50 nm, the width of the magnetic conductive posts 110a and 110b is about 60 nm, the thickness of the magnetic conductive posts 110a and 110b is about 100 nm, and a perpendicular magnetic field greater than 500 Oe is provided by the magnetic conductive posts 110a and 110b having a thickness of about 100 nm.

In some alternative embodiments, the width of the SHE-assisted layer 120 is about 130 nm, the thickness of the SHE-assisted layer 120 is about 5 nm, the radius of the conductive vias 140 is about 15 nm, the thickness of the conductive vias 140 is about 50 nm, the width of the magnetic conductive posts 110a and 110b is about 60 nm, the thickness of the magnetic conductive posts 110a and 110b is about 120 nm, and a perpendicular magnetic field about 550 Oe is provided by the magnetic conductive posts 110a and 110b having a thickness of about 120 nm.

With the perpendicular magnetic field greater than 400 Oe provided from the magnetic conductive posts 110a and 110b, the writing procedure of the SHE-assisted SOT-MRAM cell 100 can be performed successfully. On the contrary, without the perpendicular magnetic field greater than 400 Oe provided from the magnetic conductive posts 110a and 110b, the writing procedure of the SHE-assisted SOT-MRAM cell 100 may fail.

In a read procedure, a read current $I_{R\_SOT}$ flows into the MTJ structure 130 of the SHE-assisted SOT-MRAM cell 100. When magnetizations of the first ferromagnetic layer 132 and the second ferromagnetic layer 136 are parallel to each other in the SHE-assisted SOT-MRAM cell 100, the resistance of the SHE-assisted SOT-MRAM cell 100 reaches a minimum value, thereby the read current $I_{R\_SOT}$ reading a "0" code. When both magnetizations of the first ferromagnetic layer 132 and the second ferromagnetic layer 136 are antiparallel to each other in the SHE-assisted SOT-MRAM cell 100, the resistance of the SHE-assisted SOT-MRAM cell 100 reaches a maximum value, thereby the read current $I_{R\_SOT}$ reading a "1" code.

Figure 2:
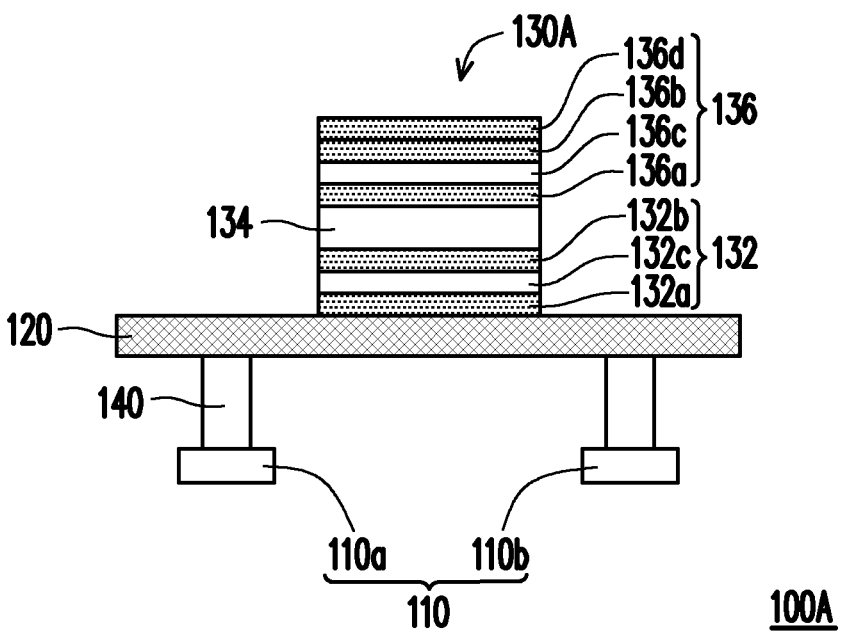
FIG. 2 and FIG. 3 are cross-sectional diagrams of the SHE-assisted SOT-MRAM cells 100A and 100B in accordance with some other embodiments.
Figure 3:
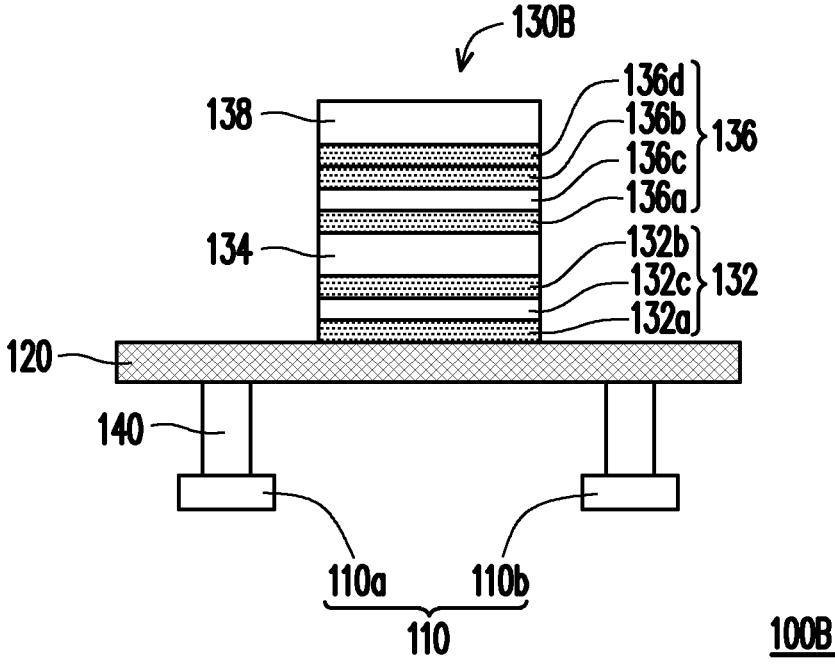

FIG. 2 and FIG. 3 are cross-sectional diagrams of the SHE-assisted SOT-MRAM cells 100A and 100B in accordance with some other embodiments.

Referring to FIG. 2, an SHE-assisted SOT-MRAM cells 100A including a MTJ structure 130A is illustrated. The MTJ structure 130A of the SHE-assisted SOT-MRAM cells 100A includes a first ferromagnetic layer 132 disposed on and in contact with the SHE-assisted layer 120; a second ferromagnetic layer 136 disposed over the first ferromagnetic layer 132; and a tunneling barrier layer 134 disposed between the first ferromagnetic layer 132 and the second ferromagnetic layer 136. The first ferromagnetic layer 132 includes a first free layer 132a disposed on the SHE-assisted layer 120; a second free layer 132c disposed over the first free layer 132a; and a spacer 132c between the first free layer 132a and the second free layer 132b. The material of the first free layer 132a may be or include Fe, Co, NoFe, CoFe, CoFeB or the like. The material of the second free layer 132b may be or include Fe, Co, NoFe, CoFe, CoFeB or the like. The material of the spacer 132c may be or include Ru or other suitable materials. The material of the first free layer 132a and the material of the second free layer 132b may be different from each other. The second ferromagnetic layer 136 includes a reference layer 136a disposed on the tunneling barrier layer 134; a first magnetic pinned layer 136b disposed over the reference layer 136a; and a spacer 136c between the reference layer 136a and the magnetic pinned layer 136b. In some embodiments, the magnetic field of the reference layer 136a and the magnetic field of the magnetic pinned layer 136b have opposite orientations. The second ferromagnetic layer 136 may further includes a second magnetic pinned layer 136d disposed over the first magnetic pinned layer 136b. The material of the reference layer 136a may be or include Fe, Co, NoFe, CoFe, CoFeB or the like. The material of the first magnetic pinned layer 136b may be or include Fe, Co, NoFe, CoFe, CoFeB or the like. The material of the spacer 136c may be or include Ru or other suitable materials. The material of the second magnetic pinned layer 136d may be or include Fe, Co, NoFe, CoFe, CoFeB or the like. The material of the reference layer 136a, the first magnetic pinned layer 136b and the second magnetic pinned layer 136d may be different from one another.

In some other embodiments, the second magnetic pinned layer 136d is omitted.

As illustrated in FIG. 2, the memory device may further include a pair of conductive vias 140, wherein the pair of conductive vias 140 are disposed between the pair of magnetic conductive posts 110 and the SHE-assisted layer 120. The pair of magnetic conductive posts 110 are electrically connected to the SHE-assisted layer 120 through the pair of conductive vias 140. The level height where the pair of conductive vias 140 are located is between the level height of the pair of magnetic conductive posts 110 and the level height of the SHE-assisted layer 120. The material of the pair of conductive vias 140 may be or include TaN, W, Cu or other suitable conductive materials.

Referring to FIG. 2 and FIG. 3, the MTJ structure 130B illustrated in FIG. 3 is similar with the MTJ structure 130A illustrated in FIG. 2 except that the MTJ structure 130B further includes a capping layer 138. As illustrated in FIG. 3, the capping layer 138 covers and in contact with the second magnetic pinned layer 136*d* of the second ferromagnetic layer 136. The material of the capping layer 138 may be or include Ta, Ru, or other suitable materials. In an embodiment where the second magnetic pinned layer 136*d* is omitted, the capping layer 138 covers and in contact with the first magnetic pinned layer 136*b* of the second ferromagnetic layer 136.

Figure 4:
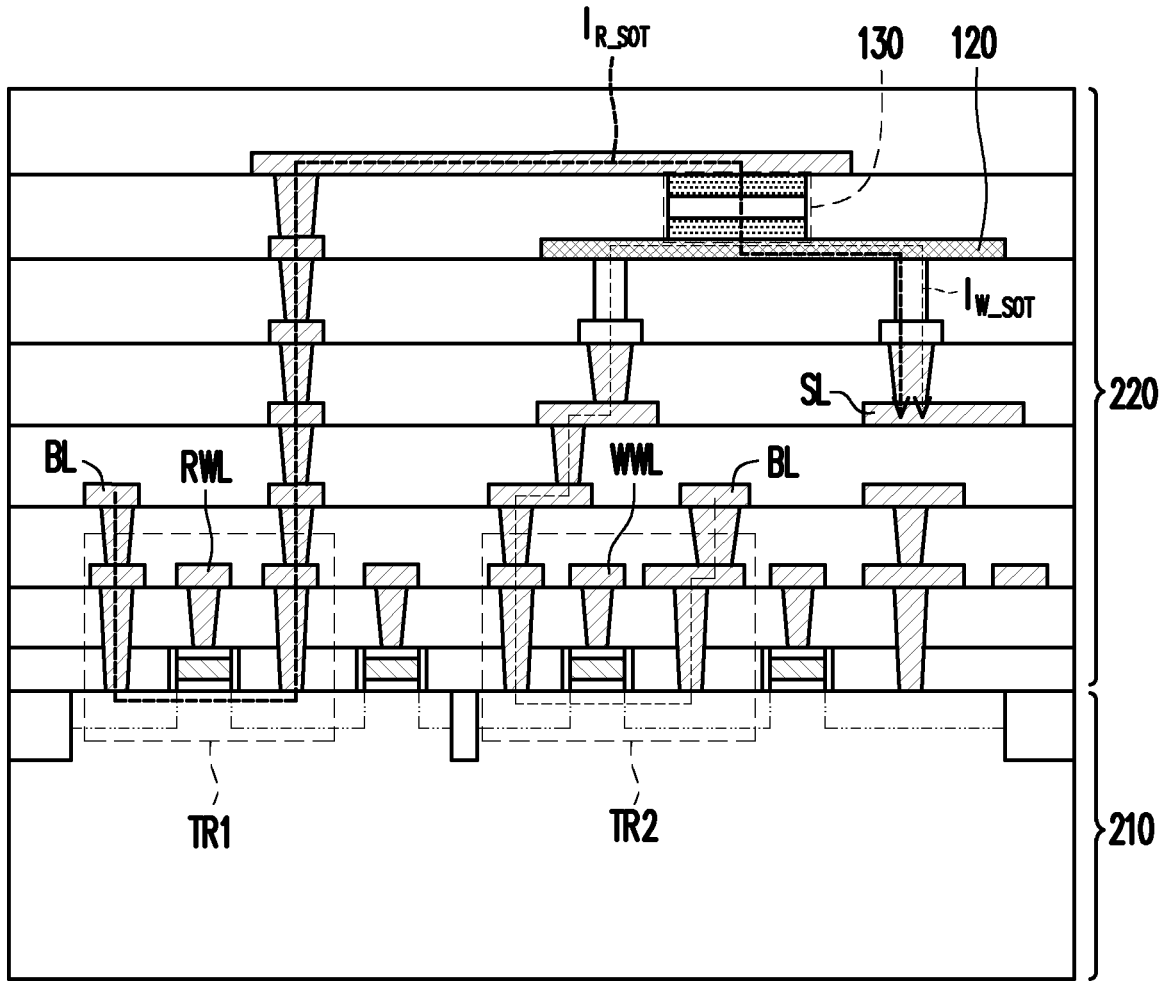
FIG. 4 is a cross-sectional diagram of a semiconductor die including embedded an SOT-MRAM cell in accordance with some embodiments.

FIG. 4 is a cross-sectional diagram of a semiconductor die including embedded an SOT-MRAM cell in accordance with some embodiments. Referring to FIG. 1 and FIG. 4, semiconductor die 200A may include a semiconductor substrate 210 including a plurality of first transistors TR1 and a plurality of second transistors TR2 formed thereon and an interconnect structure 220 over the semiconductor substrate 210. One first transistor TR1 and one second transistor TR2 are illustrated in FIG. 2 for simplicity. The first transistors TR1 and the second transistors TR2 formed over the semiconductor substrate 210 may be FinFETs, MOSFETs, GAA nanowire FETs, GAA nanosheet FETs or the like. The interconnect structure 220 may include a plurality of dielectric layers and a plurality of interconnect wirings (e.g., copper wirings or the like). To integrate the memory device illustrated in FIG. 1 into the semiconductor die 200A, the bit line BL, the write word line WWL, the read word line RWL, the source line SL, and the SHE-assisted SOT-MRAM cell 100 are formed to embed in the interconnect structure 220. In other words, the formation of the bit line BL, the write word line WWL, the read word line RWL, the source line SL, and the SHE-assisted SOT-MRAM cell 100 may be integrated in the fabrication of the interconnect structure 220 of the semiconductor die 200A. The detailed fabrication process will be described in accompany with FIG. 5A through FIG. 5H.

FIG. 5A through FIG. 5H are cross-sectional views for illustrating a fabricating process of the semiconductor die illustrated in FIG. 4 in accordance with some embodiments.

Figure 5A:
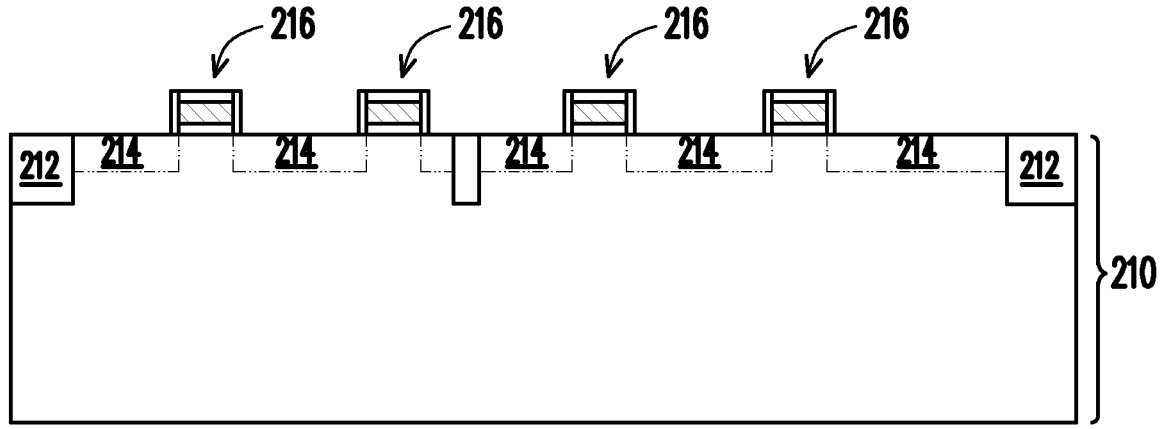
FIG. 5A through FIG. 5H are cross-sectional views for illustrating a fabricating process of the semiconductor die illustrated in FIG. 4 in accordance with some embodiments.

Referring to FIG. 5A, a semiconductor substrate 210 including doped source/drain regions. In some embodiments, the semiconductor substrate 210 is a bulk semiconductor substrate. A "bulk" semiconductor substrate refers to a substrate that is entirely composed of at least one semiconductor material. In some embodiments, the bulk semiconductor substrate includes a semiconductor material or a stack of semiconductor materials such as, for example, silicon (Si), germanium (Ge), silicon germanium (SiGe), carbon doped silicon (Si:C), silicon germanium carbon (SiGeC); or an III-V compound semiconductor such as, for example, gallium arsenide (GaAs), gallium phosphide (GaP), indium phosphide (InP), indium arsenide (InAs), indium antimonide (InSb), gallium arsenide phosphide (GaAsP), aluminum indium arsenide (AlInAs), aluminum gallium arsenide (AlGaAs), gallium indium arsenide (GaInAs), gallium indium phosphide (GaInP), or gallium indium arsenide phosphide (GaInAsP). In some embodiments, the bulk semiconductor substrate includes a single crystalline semiconductor material such as, for example, single crystalline silicon. In some embodiments, the bulk semiconductor substrate is doped depending on design requirements. In some embodiments, the bulk semiconductor substrate is doped with p-type dopants or n-type dopants. The term "p-type" refers to the addition of impurities to an intrinsic semiconductor that creates deficiencies of valence electrons. Exemplary p-type dopants, i.e., p-type impurities, include, but are not limited to, boron, aluminum, gallium, and indium. "N-type" refers to the addition of impurities that contribute free electrons to an intrinsic semiconductor. Exemplary n-type dopants, i.e., n-type impurities, include, but are not limited to, antimony, arsenic, and phosphorous. If doped, the semiconductor substrate 210, in some embodiments, has a dopant concentration in a range from $1.0 \times 10^{14}$ atoms/cm$^3$ to $1.0 \times 10^{17}$ atoms/cm$^3$, although the dopant concentrations may be greater or smaller. In some embodiments, the semiconductor substrate 210 is a semiconductor-on-insulator (SOI) substrate including a top semiconductor layer formed on an insulator layer (not shown). The top semiconductor layer includes the above-mentioned semiconductor material such as, for example, Si, Ge, SiGe, Si:C, SiGeC; or an III-V compound semiconductor including GaAs, GaP, InP, InAs, InSb, GaAsP, AlInAs, AlGaAs, GaInAs, GaInP, or GaInASP. The insulator layer is, for example, a silicon oxide layer, or the like. The insulator layer is provided over a base substrate, typically a silicon or glass substrate.

A plurality of isolation structures 212 may be formed in the semiconductor substrate 210 to define an active area where the first transistors TR1 and TR illustrated in FIG. 1 are formed. In some embodiments, source/drain regions 214 and gate structures 216 of the first and second transistors TR1 and TR2 may be formed over the semiconductor substrate 210.

Figure 5B:
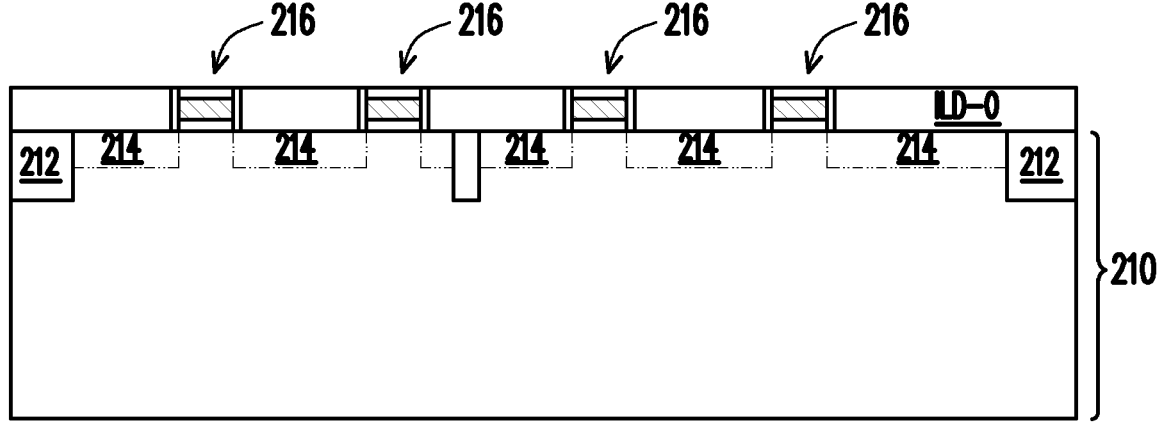

Referring to FIG. 5B, after forming the source/drain regions 214 and gate structures 216 of the first and second transistors TR1 and TR2, an interlayer dielectric layer ILD-0 is formed over the semiconductor substrate 210. In some embodiments, the interlayer dielectric layer ILD-0 includes silicon oxide. Alternatively, in some embodiments, the interlayer dielectric layer ILD-0 includes a low-k dielectric material having a dielectric constant (k) less than 4. In some embodiments, the low-k dielectric material has a dielectric constant from about 1.2 to about 3.5. In some embodiments, the interlayer dielectric layer ILD-0 includes tetraethylorthosilicate (TEOS) formed oxide, undoped silicate glass, or doped silicate glass such as borophosphosilicate glass (BPSG), fluorosilica glass (FSG), phosphosilicate glass (PSG), boron doped silicon glass (BSG), and/or other suitable dielectric materials. In some embodiments, the interlayer dielectric layer ILD-0 is deposited by CVD, PECVD, PVD, or spin coating. In some embodiments, the interlayer dielectric layer ILD-0 is deposited to have a top surface above the top surface of the gate structures 216. The interlayer dielectric layer ILD-0 is subsequently planarized, for example, by CMP and/or a recess etch using the gate structures 216 as a polishing and/or etch stop. After the planarization, the interlayer dielectric layer ILD-0 has a surface substantially coplanar with the top surface of the gate structures 216.

Figure 5C:
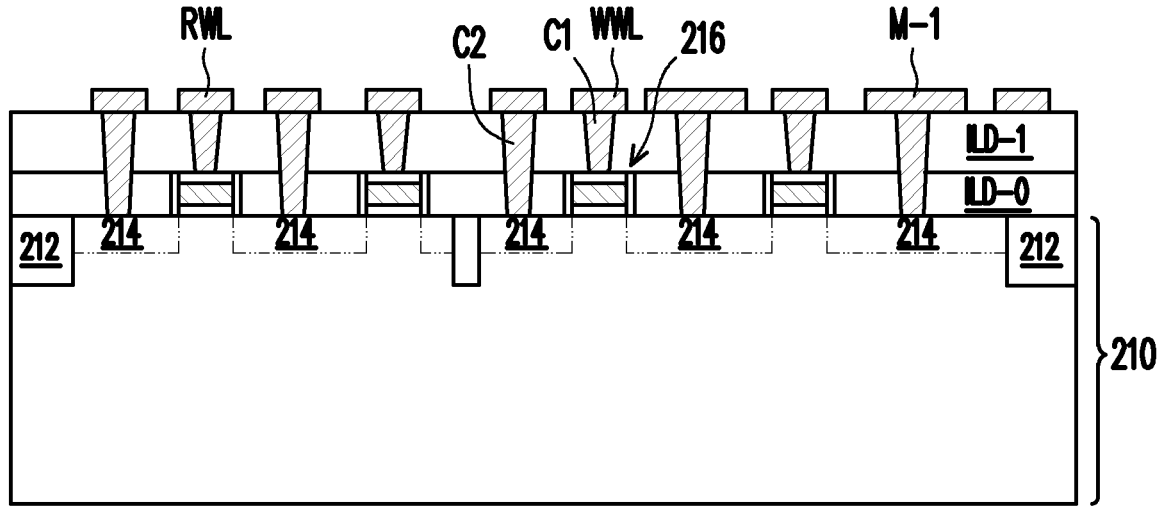

Referring to FIG. 5C, after forming the interlayer dielectric layer ILD-0, an interlayer dielectric layer ILD-1 is formed to cover the interlayer dielectric layer ILD-0. In some embodiments, the interlayer dielectric layer ILD-1 includes silicon oxide. Alternatively, in some embodiments, the interlayer dielectric layer ILD-1 includes a low-k dielectric material having a dielectric constant (k) less than 4. In some embodiments, the low-k dielectric material has a dielectric constant from about 1.2 to about 3.5. In some embodiments, the interlayer dielectric layer ILD-1 includes TEOS formed oxide, undoped silicate glass, or doped silicate glass such as BPSG, FSG, PSG, BSG, and/or other suitable dielectric materials. In some embodiments, the interlayer dielectric layer ILD-1 is deposited by CVD, PECVD, PVD, or spin coating. In some embodiments, the interlayer dielectric layer ILD-1 is deposited to have a top surface. The interlayer dielectric layer ILD-0 and the interlayer dielectric layer ILD-1 are patterned to formed contact openings for exposing portions of the source/drain regions 214. Then, metallic material is formed to cover the interlayer dielectric layer ILD-1 and fill the opening defined in the dielectric layer ILD-0 and the interlayer dielectric layer ILD-1. The metallic material is subsequently patterned, for example, by photolithography and etch processes such that gate contacts C1, source/drain contacts C2, and interconnect wirings M-1 are formed, wherein the interconnect wirings M-1 are formed over the interlayer dielectric layer ILD-1, the gate contacts C1 are in contact with the gate structure 216, and the source-drain contacts C2 are in contact with the source/drain regions 214.

Figure 5D:
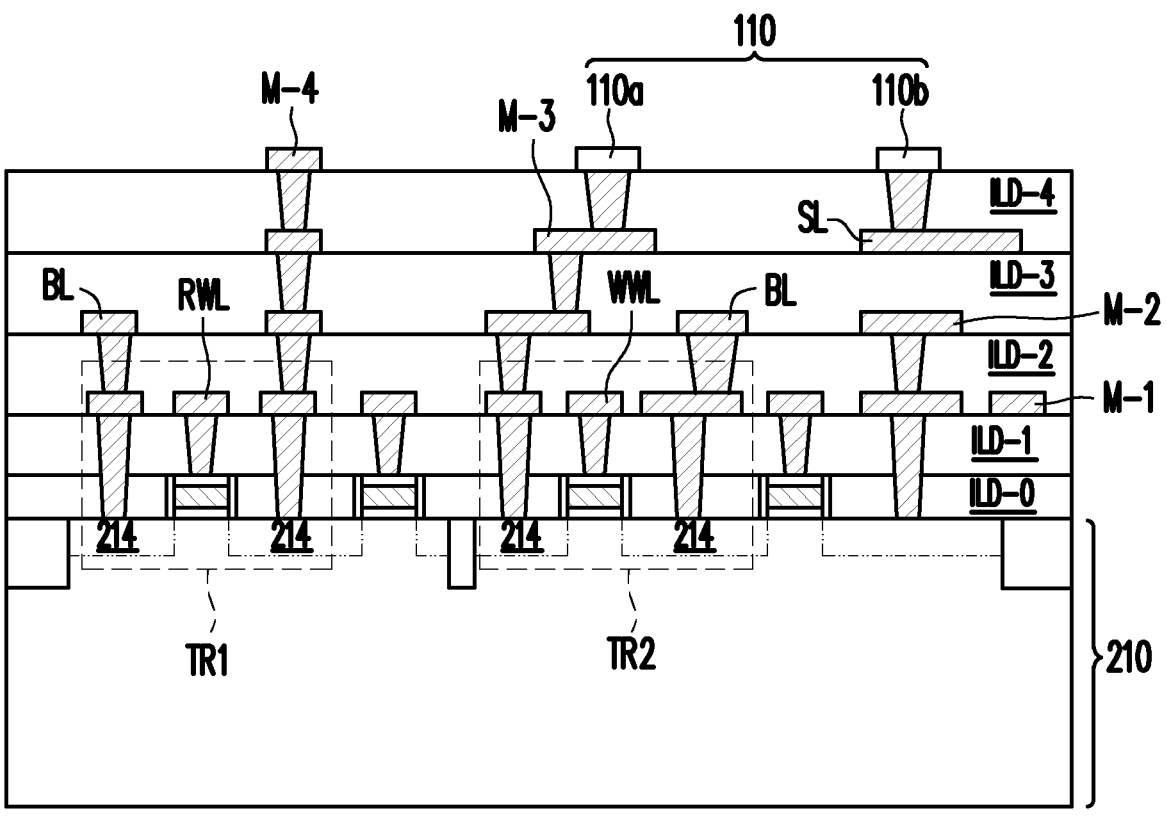

Referring to FIG. 5D, an interlayer dielectric layer ILD-2, interconnect wirings M-2, an interlayer dielectric layer ILD-3, interconnect wirings M-3, an interlayer dielectric layer ILD-4, and interconnect wirings M-4 are sequentially formed over the interlayer dielectric layer ILD-1. The fabrication processes of the interlayer dielectric layer ILD-2, the interconnect wirings M-2, the interlayer dielectric layer ILD-3, the interconnect wirings M-3, the interlayer dielectric layer ILD-4, and the interconnect wirings M-4 are similar with the fabrication processes of the interlayer dielectric layer ILD-1 and the interconnect wirings M-1. Detailed description related to the fabrication process is thus omitted.

In some embodiments, after forming the interconnect wirings M-1, the write word line WWL and the read word line RWL are formed to electrically connect to the gate structures 216 of the first and second transistors TR1 and TR2. For simplicity, only one write word line WWL and one read word line RWL are illustrated in FIG. 5C and FIG. 5D. In some other embodiments, the write word line WWL and the read word line RWL are formed by more than one layer of interconnect wirings in the interconnect structure. The number of the interconnect wirings included in the write word line WWL and the read word line RWL is not limited in the present invention.

In some embodiments, after forming the interconnect wirings M-2, bit lines BL are formed to electrically connect to the source/drain regions 214 of the first and second transistors TR1 and TR2. For simplicity, two bit lines BL are illustrated in FIG. 5D. In some other embodiments, the bit lines BL are formed by more than two layers of interconnect wirings in the interconnect structure. In some alternative embodiments, the bit lines are formed by less than or greater than two layers of interconnect wirings in the interconnect structure. The number of the interconnect wirings included in the bit lines BL is not limited in the present invention.

In some embodiments, after forming the interconnect wirings M-3, a source line SL is formed on the interlayer dielectric layer ILD-3. For simplicity, only one source line SL is illustrated in FIG. 5D. In some other embodiments, the source line SL is formed by other layer of interconnect wirings.

In some embodiments, after forming the interconnect wirings M-4, a pair of magnetic conductive posts 110 including the first magnetic conductive post 110*a* and the second magnetic conductive post 110*b* are formed on the interlayer dielectric layer ILD-4. For simplicity, only the first magnetic conductive post 110*a* and the second magnetic conductive post 110*b* are illustrated in FIG. 5D. In some other embodiments, the first magnetic conductive post 110*a* and the second magnetic conductive post 110*b* are formed by other layer of interconnect wirings.

The write word line WWL, the read word line RWL, the source line SL, the pair of magnetic conductive posts 110 may be formed by multiple layers of interconnect wirings (e.g., multiple layers of the interconnect wirings M-1, M-2, M-3 and M-4). The position and distribution of the write word line WWL, the read word line RWL, the source line SL, the pair of magnetic conductive posts 110 is not limited in the present invention.

Figure 5E:
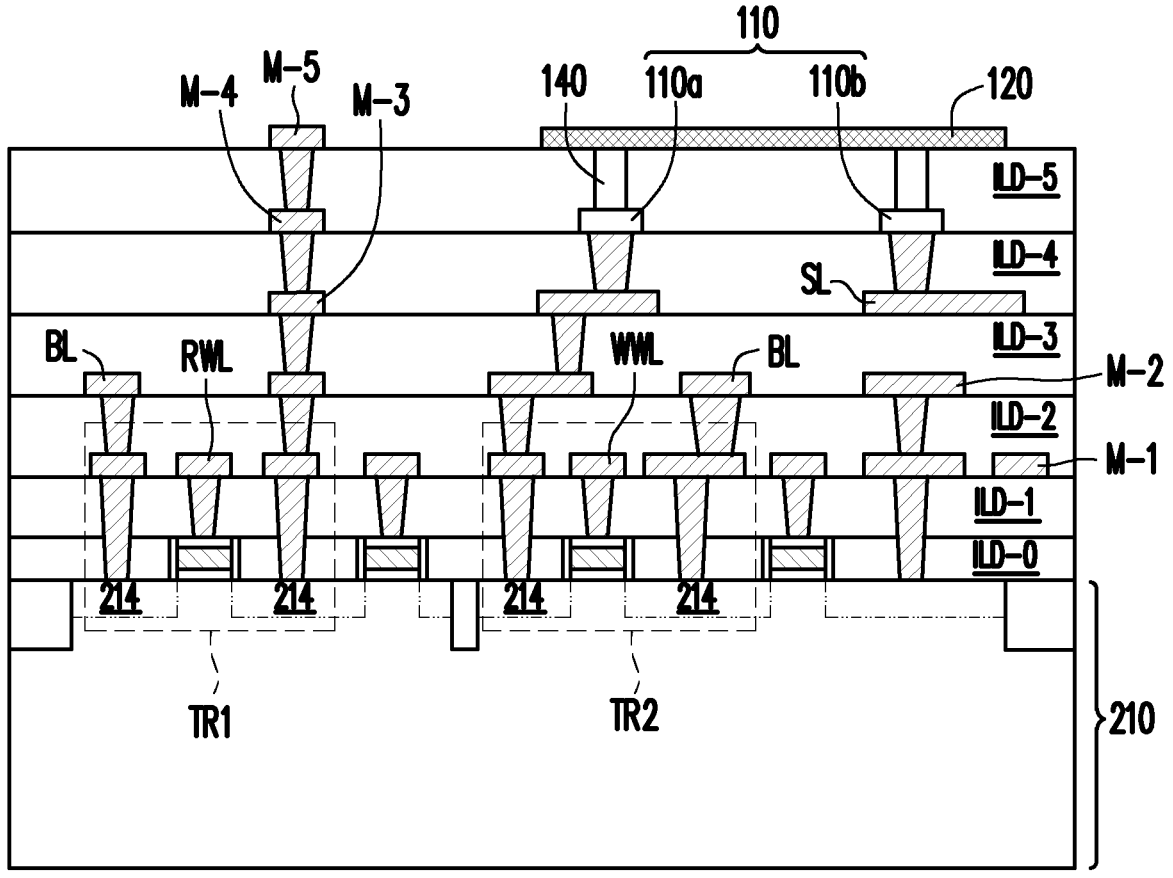
Figure 5F:
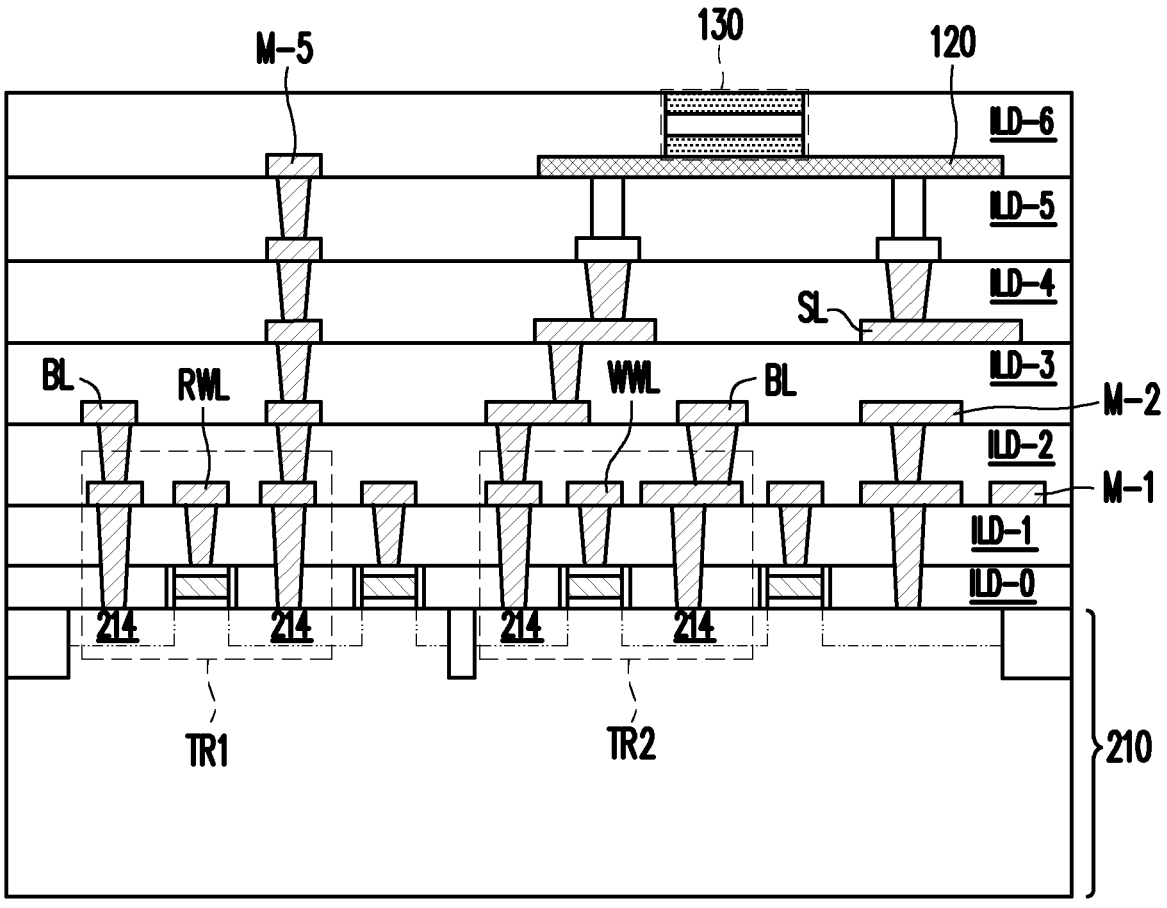

Referring to FIG. 5E, an interlayer dielectric layer ILD-5 is formed over the interlayer dielectric layer ILD-4 to cover the first magnetic conductive post 110*a* and the second magnetic conductive post 110*b*. The material of the interlayer dielectric layer ILD-5 may be similar with that of the interlayer dielectric layer ILD-0. In some embodiments, the interlayer dielectric layer ILD-5 is deposited by CVD, PECVD, PVD, or spin coating. The interlayer dielectric layer ILD-5 is subsequently planarized, for example, by CMP and/or a recess etch.

After forming the interlayer dielectric layer ILD-5, a pair of conductive vias 140 are formed to embedded in the interlayer dielectric layer ILD-5. The pair of conductive vias 140 respectively land on the first magnetic conductive post 110*a* and the second magnetic conductive post 110*b*. In some embodiments, the pair of conductive vias 140 are deposited by CVD, PECVD, PVD, or spin coating. The pair of conductive vias 140 are subsequently planarized, for example, by CMP and/or a recess etch by using the interlayer dielectric layer ILD-5 as a polishing and/or etch stop. After the planarization process of the pair of conductive vias 140, the interlayer dielectric layer ILD-5 has a top surface substantially coplanar with the top surface of the pair of conductive vias 140.

As illustrated in FIG. 5E, interconnect wirings M-5 and an SHE-assisted layer 120 are formed on the interlayer dielectric layer ILD-5 to cover the top ends of the pair of conductive vias 140 such that the SHE-assisted layer 120 is electrically connected to the pair of conductive vias 140 as well as the pair of magnetic conductive posts 110. For simplicity, only one SHE-assisted layer 120 is illustrated in FIG. 5E. The fabrication process of the interconnect wirings M-5 is similar with the fabrication process of the interconnect wirings M-1. Detailed description related to the fabrication process is thus omitted.

In some embodiments, the interconnect wirings M-5 and the SHE-assisted layer 120 may be formed by the same material (e.g., platinum (Pt), tantalum (Ta) or other suitable heavy metallic materials). In some other embodiments, the interconnect wirings M-5 and the SHE-assisted layer 120 may be formed by different materials. For instance, the interconnect wirings M-5 includes copper wirings, and the SHE-assisted layer 120 includes platinum (Pt), tantalum (Ta) or the like. In some embodiments, the interconnect wirings M-5 may be formed prior to the formation of the SHE-assisted layer 120. In some alternative embodiments, the interconnect wirings M-5 may be formed after the formation of the SHE-assisted layer 120.

Referring to FIG. 5E, a MTJ structure 130 is formed on and in contact with the SHE-assisted layer 120. After forming the MTJ structure 130, an interlayer dielectric layer ILD-6 is formed over the interlayer dielectric layer ILD-5 to cover the MTJ structure 130, the interconnect wirings M-5 and the SHE-assisted layer 120. The material of the interlayer dielectric layer ILD-6 may be similar with that of the interlayer dielectric layer ILD-0. In some embodiments, the interlayer dielectric layer ILD-6 is deposited by CVD, PECVD, PVD, or spin coating. The interlayer dielectric layer ILD-6 is subsequently planarized, for example, by CMP and/or a recess etch until the MTJ structure 130 is revealed. As illustrated in FIG. 5E, the MTJ structure 130 lands on the top surface of the SHE-assisted layer 120 and is embedded in the interlayer dielectric layer ILD-6. After the planarization, the top surface of the MTJ structure 130 may be substantially coplanar with the top surface of the interlayer dielectric layer ILD-6.

Figure 5G:
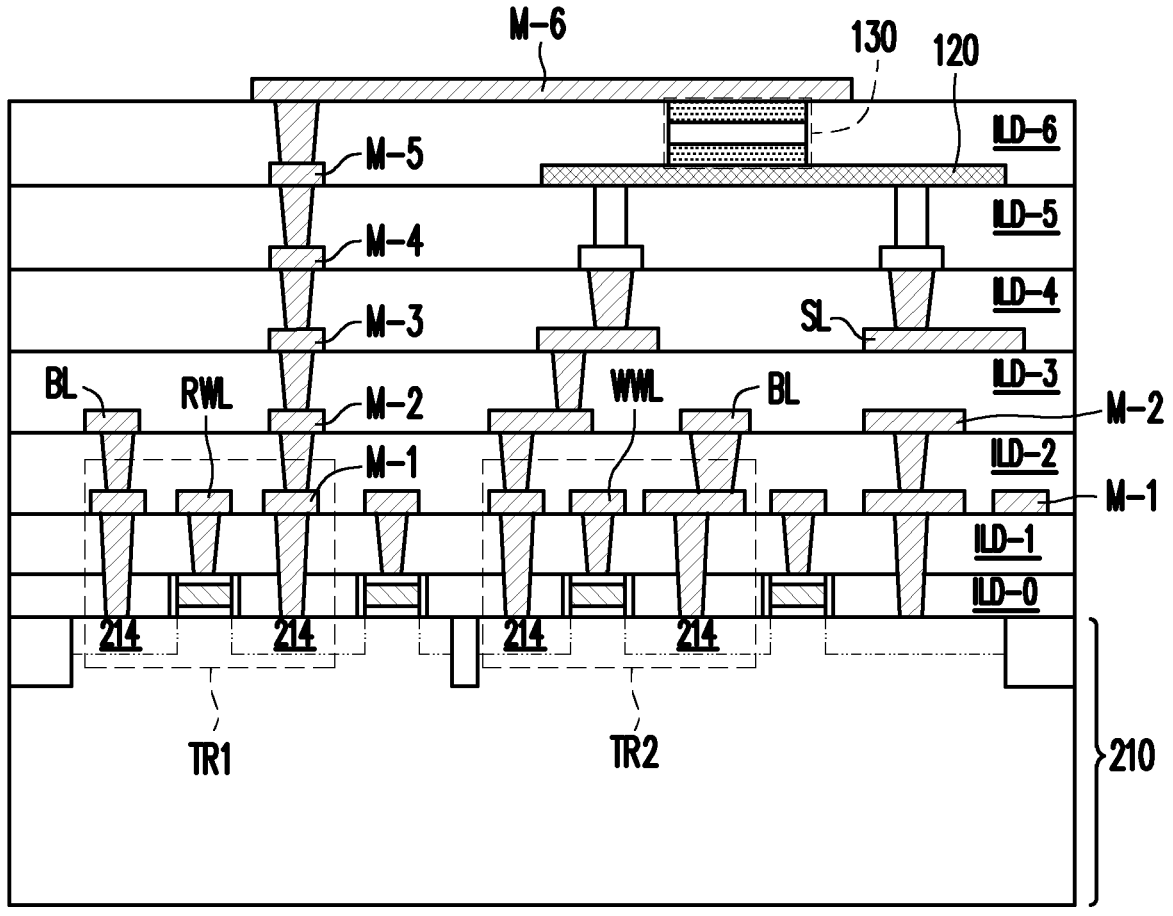
Figure 5H:
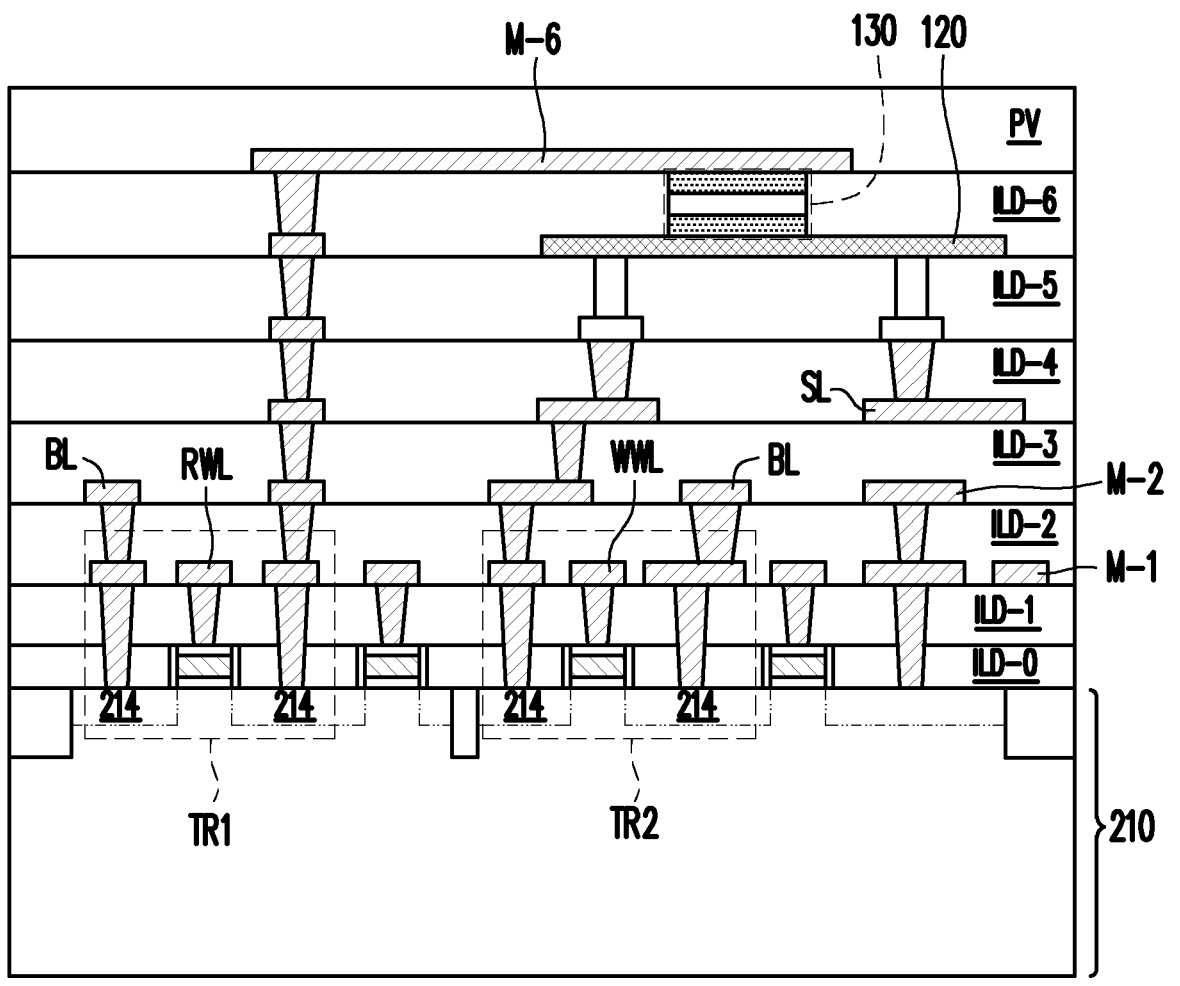

Referring to FIG. 5G, interconnect wirings M-6 are formed over the interlayer dielectric layer ILD-6, and the material of the interconnect wirings M-6 are identical with or different from that of the interconnect wirings M-5. After forming the interconnect wirings M-6, a passivation layer PV is formed over the interlayer dielectric layer ILD-6 to cover the interconnect wirings M-6. In some embodiments, the passivation layer PV includes silicon oxide, silicon nitride or the like. The passivation layer PV may be deposited by CVD, PECVD, PVD, or spin coating. As illustrated in FIG. 5G, the interconnect structure 220 includes the interlayer dielectric layer ILD-0, ILD-1, ILD-2, ILD-3, ILD-4, ILD-5, ILD-6, the interconnect wirings M-1, M-2, M-3, M-4, M-5, M-6, the pair of magnetic conductive posts 110, the SHE-assisted layer 120, the MTJ structure 130, and the passivation layer PV. The number of the interlayer dielectric layers ILD-0, ILD-1, ILD-2, ILD-3, ILD-4, ILD-5, ILD-6 as well as the number of the interconnect wirings M-1, M-2, M-3, M-4, M-5, M-6 are not limited in the present invention.

Figure 6:
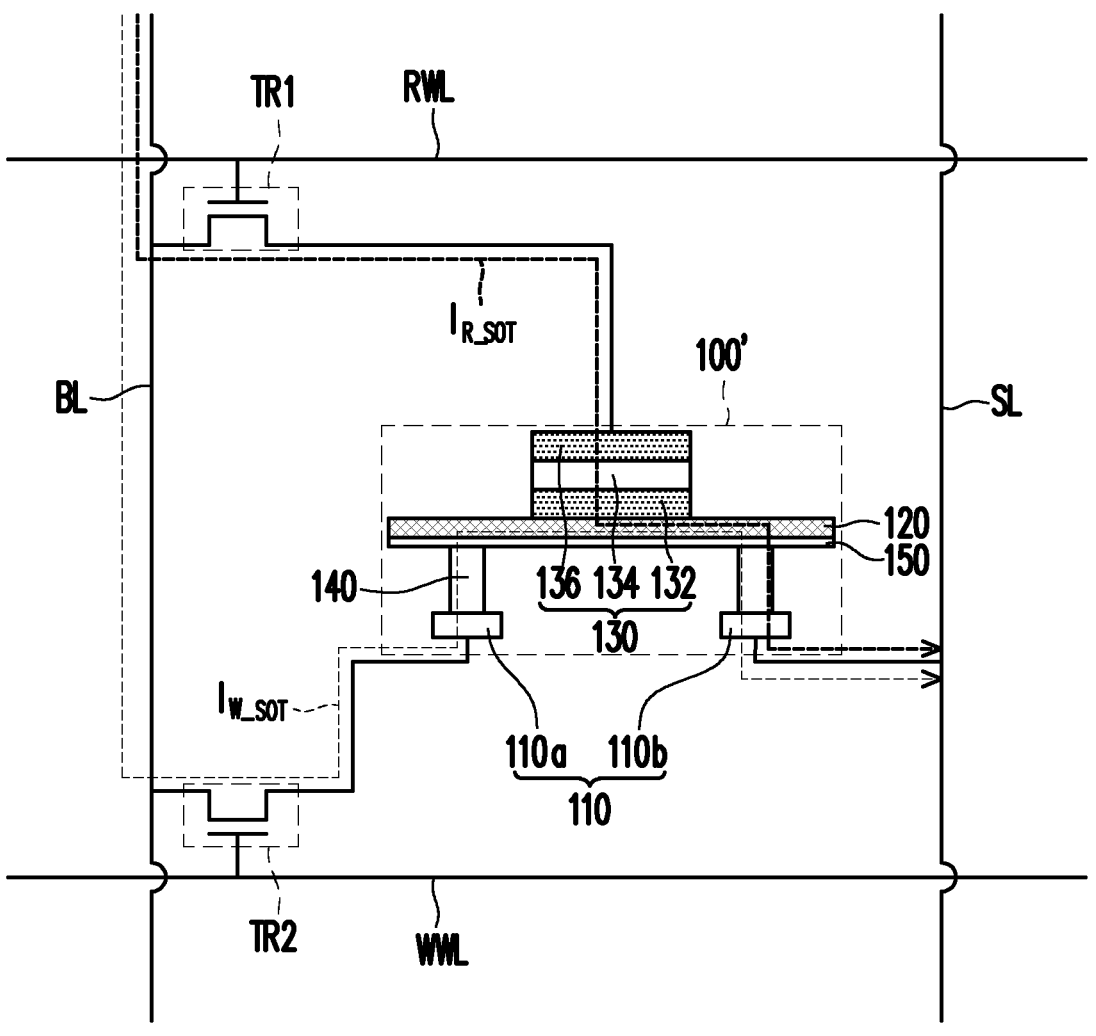
FIG. 6 illustrates a schematic view of a memory device electrically connected to a bit line, a read word line, a write word line and a source line in accordance with some other embodiments.

FIG. 6 illustrates a schematic view of a memory device electrically connected to a bit line, a read word line, a write word line and a source line in accordance with some other embodiments.

Referring to FIG. 6, the memory device illustrated in FIG. 6 includes a SHE-assisted SOT-MRAM cells 100' arranged in array. The memory device illustrated in FIG. 6 may further include bit lines BL, source lines SL, read word lines RWL, and write word lines WWL. For simplicity of illustration, only one SHE-assisted SOT-MRAM cell 100' electrically connected to one bit line BL, one source line SL, one read word line RWL and one write word line WWL is shown in FIG. 6. The respective number of the SHE-assisted SOT-MRAM cell 100', the bit line BL, the source line SL, the read word line RWL and the write word line WWL is not limited in the present invention. As illustrated in FIG. 6, the SHE-assisted SOT-MRAM cell 100' includes a pair of magnetic conductive posts 110, a Spin-Hall-Effect-assisted (SHE-assisted) layer 120, a magnetic tunneling junction (MTJ) structure 130, and a bottom ferromagnetic layer 150. The bottom ferromagnetic layer 150 is disposed over and electrically connected to the pair of magnetic conductive posts 110. The SHE-assisted layer 120 is disposed on the bottom ferromagnetic layer 150, wherein the bottom ferromagnetic layer 150 and the SHE-assisted layer 120 are electrically connected to the pair of magnetic conductive posts 110. The magnetic tunneling junction (MTJ) structure 130 has perpendicular magnetic anisotropy, wherein the MTJ structure 130 is disposed on the SHE-assisted layer 120, wherein the bottom ferromagnetic layer 150 and the pair of magnetic conductive posts 110 collectively provide a perpendicular magnetic field during a write operation of the MTJ structure 130. The material of the pair of magnetic conductive posts 110 may be or include Co or other suitable ferromagnetic materials. The material of the SHE-assisted layer 120 may be or include platinum (Pt), tantalum (Ta) or other suitable heavy metallic materials. The material of the bottom ferromagnetic layer 150 may be or include NiFe or other suitable ferromagnetic materials.

In some embodiments, the pair of the magnetic conductive posts 110 include a first magnetic conductive post 110a and a second magnetic conductive post 110b spaced apart from the first magnetic conductive post 110a, and the SHE-assisted layer 120 covers as well as extends from the first magnetic conductive post 110a to the second magnetic conductive post 110b. The thickness (height) of the pair of magnetic conductive posts 110a and 110b may range from about 60 nm to about 120 nm, and the width of the pair of magnetic conductive posts 110a and 110b may be about 60 nm. The length of the SHE-assisted layer 120 may be about 100 nm, and the width of the SHE-assisted layer 120 may be about 5 nm. The length of the bottom ferromagnetic layer 150 may be about 100 nm, and the width of the bottom ferromagnetic layer 150 may be about 5 nm. In some embodiment, the length and width of the SHE-assisted layer 120 is substantially identical to the length and width of the bottom ferromagnetic layer 150, as illustrated in FIG. 6. In some other embodiment, the length and width of the SHE-assisted layer 120 is different from the length and width of the bottom ferromagnetic layer 150, not shown in figures. It is noted that one or more MTJ structures 130 may be formed on the SHE-assisted layer 120 having a length of about 100 nm.

In some embodiments, the MTJ structure 130 includes a first ferromagnetic layer 132 disposed on and in contact with the SHE-assisted layer 120; a second ferromagnetic layer 136 disposed over the first ferromagnetic layer 132; and a tunneling barrier layer 134 disposed between the first ferromagnetic layer 132 and the second ferromagnetic layer 136. The material of the first ferromagnetic layer 132 may be or include Fe, Co, NoFe, CoFe, CoFeB or the like. The material of the second ferromagnetic layer 136 may be or include Fe, Co, NoFe, CoFe, CoFeB or the like. The material of the tunneling barrier layer 134 may be or include MgO, $Al_2O_3$ or the like. The material of the first ferromagnetic layer 132 and the material of the second ferromagnetic layer 136 may be different from each other.

The magnetic field orientation of the second ferromagnetic layer 136 has at least one layer of magnetizable material with a locked magnetic field orientation, and the first ferromagnetic layer 132 has at least one layer of magnetizable material where the magnetic field orientation changes between different perpendicular orientations. When the magnetic field of the first ferromagnetic layer 132 and the second ferromagnetic layer 136 are aligned having the same orientation, the MTJ structure 130 allows a large amount of current to flow in comparison to the allowed amount of current flowing through the MTJ structure 130 when the magnetic field of the first ferromagnetic layer 132 and the magnetic field of the second ferromagnetic layer 136 have opposite orientations. The different amounts of current are associated with different information states (e.g., a high amount of current is associated with a "1" bit, and a low amount of current is associated a "0" bit, or vice versa) of the MTJ structure 130.

As illustrated in FIG. 6, the memory device further includes a first transistor TR1 and a second transistor TR2. The gate of the first transistor TR1 is electrically connected to the read word line RWL, one of the pair of source/drain of the first transistor TR1 is electrically connected to the bit line BL, and the other one of the pair of source/drain of the first transistor TR1 is electrically connected to the second ferromagnetic layer 136 of the SHE-assisted SOT-MRAM cell 100'. The gate of the second transistor TR2 is electrically connected to the write word line WWL, one of the pair of source/drain of the second transistor TR2 is electrically connected to the bit line BL, and the other one of the pair of source/drain of the second transistor TR2 is electrically connected to the first magnetic conductive posts 110a. Furthermore, the second magnetic conductive posts 110b is electrically connected to the source line SL.

When a SOT write procedure of the SHE-assisted SOT-MRAM cell 100' is performed, the channel of the second transistor TR2 electrically coupled to the write word line WWL is turned on, and a write current $I_{W\_SOT}$ propagated by the bit line BL sequentially flows through the channel of the second transistor TR2, the first magnetic conductive posts 110a, the bottom ferromagnetic layer 150, the SHE-assisted layer 120, the second magnetic conductive posts 110b and the source line SL. During SOT write procedure of the SHE-assisted SOT-MRAM cell 100', the write current $I_{W\_SOT}$ flows through the SHE-assisted layer 120 and the bottom ferromagnetic layer 150 horizontally, and the write current $I_{W\_SOT}$ enables the first magnetic conductive posts 110a and the second magnetic conductive posts 110b providing a in-plane magnetic field, which facilitates that a bit of information is stored in the MTJ structure 130 of the SHE-assisted SOT-MRAM cell 100'. A stored bit of information is successfully written into the first ferromagnetic layer 132 of the MTJ structure 130 by applying the write current $I_{W\_SOT}$ passing through the SHE-assisted layer 120 and the bottom ferromagnetic layer 150. The applied write current $I_{W\_SOT}$ passing through the SHE-assisted layer 120 and the bottom ferromagnetic layer 150 becomes spin polarized and exerts a torque on the first ferromagnetic layer 132 of the MTJ structure 130. The direction of the write current $I_{W\_SOT}$ and magnetization of the second ferromagnetic layer 136 determine the direction of generated torque.

The bottom ferromagnetic layer 150 underlying the SHE-assisted layer 120 enhances in-plane magnetic field which facilitates the write procedure of the MTJ structure 130 in the SHE-assisted SOT-MRAM cell 100'. The magnetic flux density of in-plane magnetic field (Bx) resulted from the bottom ferromagnetic layer 150 as well as the magnetic conductive posts 110a and 110b may be about –100T. With the in-plane magnetic field provided from the bottom ferromagnetic layer 150 as well as the magnetic conductive posts 110a and 110b, the writing procedure of the SHE-assisted SOT-MRAM cell 100' can be performed successfully. On the contrary, without the in-plane magnetic field provided from the bottom ferromagnetic layer 150 as well as the magnetic conductive posts 110a and 110b, the writing procedure of the SHE-assisted SOT-MRAM cell 100' may fail.

In a read procedure, a read current $I_{R\_SOT}$ flows into the MTJ structure 130 of the SHE-assisted SOT-MRAM cell 100'. When magnetizations of the first ferromagnetic layer 132 and the second ferromagnetic layer 136 are parallel to each other in the SHE-assisted SOT-MRAM cell 100, the resistance of the SHE-assisted SOT-MRAM cell 100' reaches a minimum value, thereby the read current $I_{R\_SOT}$ reading a "0" code. When both magnetizations of the first ferromagnetic layer 132 and the second ferromagnetic layer 136 are antiparallel to each other in the SHE-assisted SOT-MRAM cell 100', the resistance of the SHE-assisted SOT-MRAM cell 100' reaches a maximum value, thereby the read current $I_{R\_SOT}$ reading a "1" code.

It is noted that the MTJ structure 130 of the SHE-assisted SOT-MRAM cell 100' may be replaced by the MTJ structure 130A illustrated in FIG. 2 or the MTJ structure 130B illustrated in FIG. 3, wherein the MTJ structure 130A and the MTJ structure 130B both have perpendicular magnetic anisotropy.

Figure 7:
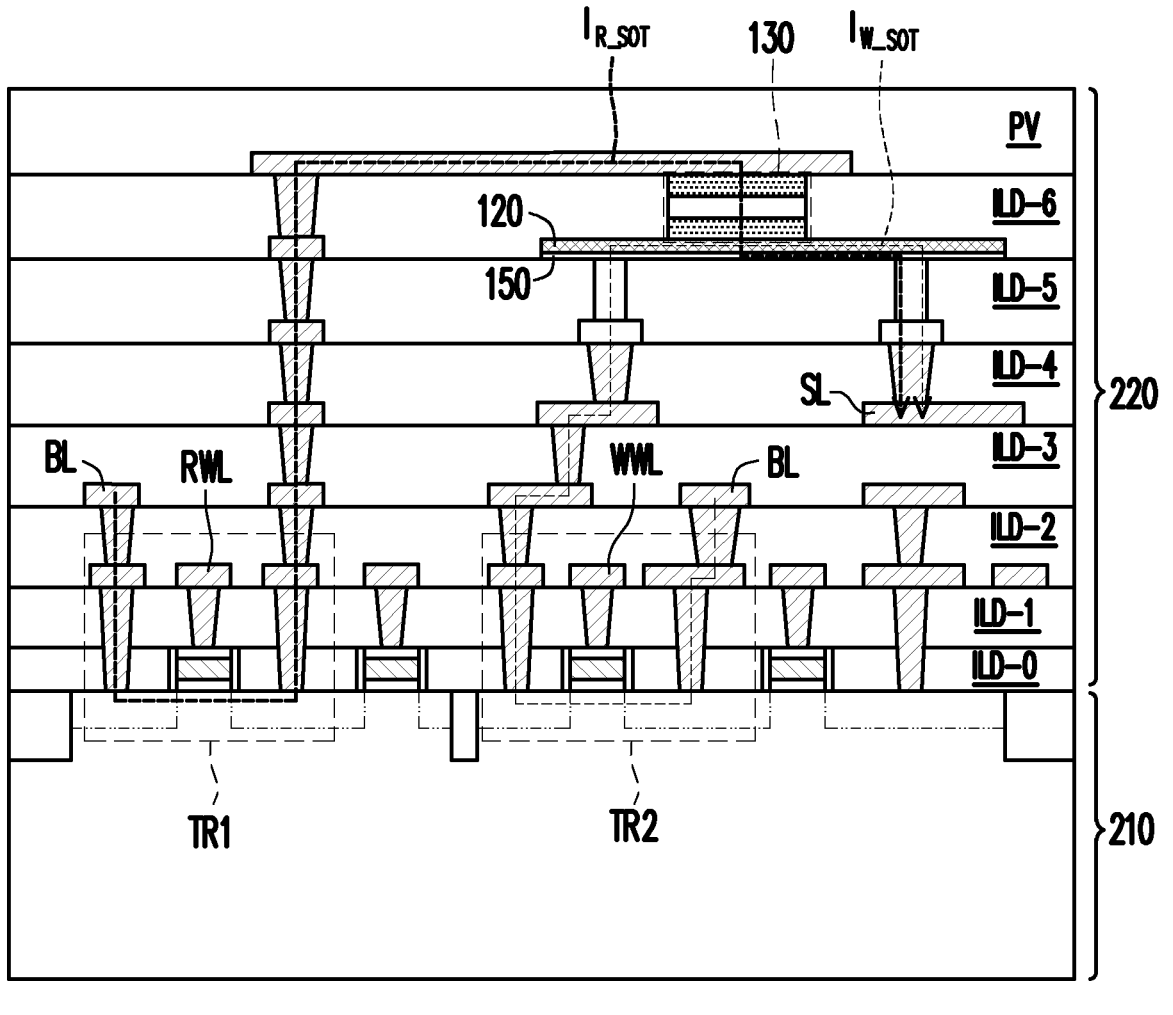
FIG. 7 is a cross-sectional diagram of a semiconductor die including an embedded SOT-MRAM cell in accordance with some other embodiments.

FIG. 7 is a cross-sectional diagram of a semiconductor die including an embedded SOT-MRAM cell in accordance with some other embodiments.

Referring to FIG. 4 and FIG. 7, the semiconductor die 200B illustrated in FIG. 7 is similar with the semiconductor die 200A illustrated in FIG. 4 except that the semiconductor die 200B further includes a bottom ferromagnetic layer 150 disposed on the top surface of the interlayer dielectric layer ILD-5.

In the above-mentioned embodiments, a magnetic field enhancement structure including, for example, the pair of conductive vias 110 or the combination of the pair of conductive vias 110 and the bottom ferromagnetic layer 150 is proposed to generate perpendicular or in-plane magnetic field such that write procedure of the SOT-MRAM cell is facilitated.

An embodiment of the present invention relates to a memory device including a pair of magnetic conductive posts, a Spin-Hall-Effect-assisted (SHE-assisted) layer, and a magnetic tunneling junction (MTJ) structure. The Spin-Hall-Effect-assisted (SHE-assisted) layer is disposed over and electrically connected to the pair of magnetic conductive posts. The magnetic tunneling junction (MTJ) structure has in-plane magnetic anisotropy, wherein the MTJ structure is disposed on the SHE-assisted layer, and the pair of magnetic conductive posts provide a perpendicular magnetic field during a write operation of the MTJ structure. In some embodiments, the pair of the magnetic conductive posts include a first magnetic conductive post and a second magnetic conductive post spaced apart from the first magnetic conductive post, and the SHE-assisted layer extends from the first magnetic conductive post to the second magnetic conductive post. In some embodiments, the MTJ structure includes a first ferromagnetic layer disposed on the SHE-assisted layer; a second ferromagnetic layer disposed over the first ferromagnetic layer; and a tunneling barrier layer disposed between the first ferromagnetic layer and the second ferromagnetic layer. In some embodiments, the MTJ structure further includes a capping layer covering the second ferromagnetic layer. In some embodiments, the first ferromagnetic layer includes a first free layer disposed on the SHE-assisted layer; a second free layer disposed over the first free layer; and a spacer between the first free layer and the second free layer. In some embodiments, the second ferromagnetic layer includes a reference layer disposed on the tunneling barrier layer; a first magnetic pinned layer disposed over the reference layer; and a spacer between the reference layer and the magnetic pinned layer. In some embodiments, the second ferromagnetic layer further includes a second magnetic pinned layer disposed over the first magnetic pinned layer. In some embodiments, the memory device further includes a pair of conductive vias, wherein the pair of conductive vias are disposed between the pair of magnetic conductive posts and the SHE-assisted layer.

Another embodiment of the present invention relates to a memory device including a pair of magnetic conductive posts, a bottom ferromagnetic layer, a Spin-Hall-Effect-assisted (SHE-assisted) layer and a magnetic tunneling junction (MTJ) structure. The bottom ferromagnetic layer is disposed over and electrically connected to the pair of magnetic conductive posts. The Spin-Hall-Effect-assisted (SHE-assisted) layer is disposed on the bottom ferromagnetic layer, wherein the bottom ferromagnetic layer and the SHE-assisted layer are electrically connected to the pair of magnetic conductive posts. The magnetic tunneling junction (MTJ) structure with perpendicular magnetic anisotropy, the MTJ structure is disposed on the SHE-assisted layer, wherein the bottom ferromagnetic layer and the pair of magnetic conductive posts collectively provide an in-plane magnetic field during a write operation of the MTJ structure. In some embodiments, the pair of the magnetic conductive posts include a first magnetic conductive post and a second magnetic conductive post spaced apart from the first magnetic conductive post, and the SHE-assisted layer extends from the first magnetic conductive post to the second magnetic conductive post. In some embodiments, the MTJ structure includes a first ferromagnetic layer disposed on the SHE-assisted layer; a second ferromagnetic layer disposed over the first ferromagnetic layer; and a tunneling barrier layer disposed between the first ferromagnetic layer and the second ferromagnetic layer. In some embodiments, the MTJ structure further includes a capping layer covering the second ferromagnetic layer. In some embodiments, the first ferromagnetic layer includes a first free layer disposed on the SHE-assisted layer; a second free layer disposed over the first free layer; and a spacer between the first free layer and the second free layer. In some embodiments, the second ferromagnetic layer includes a reference layer disposed on the tunneling barrier layer; a first magnetic pinned layer disposed over the reference layer; and a spacer between the reference layer and the magnetic pinned layer. In some embodiments, the second ferromagnetic layer further includes a second magnetic pinned layer disposed over the first magnetic pinned layer. In some embodiments, the memory device further includes a pair of conductive vias, wherein the pair of conductive vias are disposed between the pair of magnetic conductive posts and the SHE-assisted layer.

Still another embodiment of the present invention relates to a semiconductor die including a semiconductor substrate and an interconnect structure. The interconnect structure is disposed over the semiconductor substrate, the interconnect structure includes stacked interlayer dielectric layers, interconnect wirings embedded in the interlayer dielectric layers and a memory device embedded in the interlayer dielectric layers. The memory device includes a pair of magnetic conductive posts, a Spin-Hall-Effect-assisted (SHE-assisted) layer and a magnetic tunneling junction (MTJ) structure. The Spin-Hall-Effect-assisted (SHE-assisted) layer is disposed over and electrically connected to the pair of magnetic conductive posts. The MTJ structure is disposed on the SHE-assisted layer, and the pair of magnetic conductive posts provide a magnetic field during a write operation of the MTJ structure. In some embodiments, the MTJ structure comprises in-plane magnetic anisotropy, and the pair of magnetic conductive posts provide a perpendicular magnetic field during the write operation of the MTJ structure. In some embodiments, the semiconductor die further includes a bottom ferromagnetic layer disposed on a bottom surface of the SHE-assisted layer, wherein the bottom ferromagnetic layer is disposed between the SHE-assisted layer and the pair of magnetic conductive posts, the bottom ferromagnetic layer is electrically connected to the SHE-assisted layer and the pair of magnetic conductive posts, and wherein the bottom ferromagnetic layer and the pair of magnetic conductive posts collectively provide an in-plane magnetic field during the write operation of the MTJ structure. In some embodiments, the MTJ structure includes a first ferromagnetic layer disposed on and in contact with the SHE-assisted layer; a second ferromagnetic layer disposed over the first ferromagnetic layer; and a tunneling barrier layer disposed between the first ferromagnetic layer and the second ferromagnetic layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory device, comprising:
a dielectric layer;
a pair of magnetic conductive posts embedded in the dielectric layer;
a pair of conductive vias disposed on the pair of magnetic conductive posts and embedded in the dielectric layer, wherein the pair of magnetic conductive posts comprises a first magnetic conductive post, the pair of conductive vias comprises a first conductive via, and a width of the first magnetic conductive post is greater than a diameter of the first conductive via; a bottom ferromagnetic layer disposed on the dielectric layer and covering the pair of conductive vias; a Spin-Hall-Effect-assisted (SHE-assisted) layer disposed on the bottom ferromagnetic layer; and a magnetic tunneling junction (MTJ) structure disposed on the SHE-assisted layer, wherein the pair of magnetic conductive posts and the bottom ferromagnetic layer provide a perpendicular magnetic field during a write operation of the MTJ structure.

2. The memory device according to claim 1, wherein the pair of the magnetic conductive posts further comprise a second magnetic conductive post spaced apart from the first magnetic conductive post, and a width of the second magnetic conductive post is greater than a radius of the second conductive via, and the bottom ferromagnetic layer provide the perpendicular magnetic field greater than 400 Oe during the write operation of the MTJ structure.

3. The memory device according to claim 1, wherein the MTJ structure comprises:
a first ferromagnetic layer disposed on the SHE-assisted layer;
a second ferromagnetic layer disposed over the first ferromagnetic layer; and
a tunneling barrier layer disposed between the first ferromagnetic layer and the second ferromagnetic layer.

4. The memory device according to claim 3, wherein the MTJ structure further comprises a capping layer covering the second ferromagnetic layer.

5. The memory device according to claim 3, wherein the first ferromagnetic layer comprises:
a first free layer disposed on the SHE-assisted layer;
a second free layer disposed over the first free layer; and
a spacer between the first free layer and the second free layer.

6. The memory device according to claim 3, wherein the second ferromagnetic layer comprises:
a reference layer disposed on the tunneling barrier layer;
a first magnetic pinned layer disposed over the reference layer; and
a spacer between the reference layer and the magnetic pinned layer.

7. The memory device according to claim 6, wherein the second ferromagnetic layer further comprises a second magnetic pinned layer disposed over the first magnetic pinned layer.

8. The memory device according to claim 2, wherein a lateral distance between the first conductive via and the second conductive via is greater than a lateral distance between the first magnetic conductive post and the second magnetic conductive post.

9. A memory device, comprising:
a dielectric layer comprising a first portion and a second portion disposed on the first portion;
a pair of magnetic conductive posts embedded in the dielectric layer;
a pair of conductive vias embedded in the dielectric layer and disposed on the pair of magnetic conductive posts;
a bottom ferromagnetic layer disposed over and electrically connected to the pair of magnetic conductive posts;
a Spin-Hall-Effect-assisted (SHE-assisted) layer disposed on the bottom ferromagnetic layer, wherein the bottom ferromagnetic layer and the SHE-assisted layer are electrically connected to the pair of magnetic conductive posts; and
a magnetic tunneling junction (MTJ) structure disposed on the SHE-assisted layer, wherein the bottom ferromagnetic layer and the pair of magnetic conductive posts collectively provide a perpendicular magnetic field during a write operation of the MTJ structure, and wherein the first portion of the dielectric layer is laterally between the pair of the magnetic consecutive posts, the second portion of the dielectric layer is laterally between the pair of conductive vias, and a lateral dimension of the first portion is greater than the lateral dimension of the MTJ, and the lateral dimension of the first portion is less than the lateral dimension of the second portion.

10. The memory device according to claim 9, wherein a width of the pair of magnetic conductive posts is greater than a radius of the pair of conductive vias.

11. The memory device according to claim 9, wherein the MTJ structure comprises:
a first ferromagnetic layer disposed on the SHE-assisted layer;
a second ferromagnetic layer disposed over the first ferromagnetic layer; and
a tunneling barrier layer disposed between the first ferromagnetic layer and the second ferromagnetic layer.

12. The memory device according to claim 11, wherein the MTJ structure further comprises a capping layer covering the second ferromagnetic layer.

13. The memory device according to claim 11, wherein the first ferromagnetic layer comprises:
a first free layer disposed on the SHE-assisted layer;
a second free layer disposed over the first free layer; and
a spacer between the first free layer and the second free layer.

14. The memory device according to claim 11, wherein the second ferromagnetic layer comprises:
a reference layer disposed on the tunneling barrier layer;
a first magnetic pinned layer disposed over the reference layer; and a spacer between the reference layer and the magnetic pinned layer.

15. The memory device according to claim 14, wherein the second ferromagnetic layer further comprises a second magnetic pinned layer disposed over the first magnetic pinned layer.

16. The memory device according to claim 9, wherein the perpendicular magnetic field is greater than 400 Oe.

17. A semiconductor die, comprising:
a semiconductor substrate;
an interconnect structure disposed over the semiconductor substrate, the interconnect structure comprising stacked interlayer dielectric layers, interconnect wirings embedded in the interlayer dielectric layers and a memory device embedded in the interlayer dielectric layers, and the memory device comprising: a pair of magnetic conductive posts; a pair of conductive vias disposed on the pair of magnetic conductive posts, wherein the pair of magnetic conductive posts comprises a first magnetic conductive post, the pair of conductive vias comprises a first conductive via, and a width of the first magnetic conductive post is greater than a diameter of the first conductive via;
a Spin-Hall-Effect-assisted (SHE-assisted) layer disposed over and electrically connected to the pair of magnetic conductive posts;
a bottom ferromagnetic layer extending from a first magnetic conductive post among the pair of magnetic conductive posts to a second conductive post among the pair of magnetic conductive posts; and
a magnetic tunneling junction (MTJ) structure, wherein the bottom ferromagnetic layer and the MTJ structure are disposed at opposite surfaces of the SHE-assisted layer, and wherein the pair of magnetic conductive posts and the bottom ferromagnetic layer provide a perpendicular magnetic field during a write operation of the MTJ structure.

18. The semiconductor die according to claim 17, wherein the perpendicular magnetic field is greater than 400 Oe.

19. The semiconductor die according to claim 17, wherein the pair of magnetic conductive posts and the pair of conductive vias are embedded in an interlayer dielectric layer among the interlayer dielectric layers, the interlayer dielectric layer comprises a first portion and a second portion disposed on the first portion, the first portion is laterally between the pair of the magnetic consecutive posts, the second portion is laterally between the pair of conductive vias, a lateral dimension of the second portion is greater than a lateral dimension of the MTJ, a lateral dimension of the first portion is greater than the lateral dimension of the MTJ, and the lateral dimension of the first portion is less than the lateral dimension of the second portion.

20. The semiconductor die according to claim 17, wherein the MTJ structure comprises:
a first ferromagnetic layer disposed on and in contact with the SHE-assisted layer;
a second ferromagnetic layer disposed over the first ferromagnetic layer; and
a tunneling barrier layer disposed between the first ferromagnetic layer and the second ferromagnetic layer.

* * * * *